United States Patent [19]

Light, Jr. et al.

[11] Patent Number: 4,494,079
[45] Date of Patent: Jan. 15, 1985

[54] MICROPROCESSOR CONTROLLED PHASE LOCKED LOOPS

[75] Inventors: David O. Light, Jr.; Frank Hayes, III, both of Huntsville; Joseph R. McGinty, Madison, all of Ala.

[73] Assignee: The United States of America as represented by the Secretary of the Army, Washington, D.C.

[21] Appl. No.: 328,892

[22] Filed: Dec. 9, 1981

[51] Int. Cl.³ .......................... H03K 7/00; H03K 5/26
[52] U.S. Cl. .................................. 331/1 A; 331/1 R; 331/2; 331/14; 331/18; 307/510; 328/14
[58] Field of Search ........................ 307/234, 510, 517; 328/155; 331/1 R, 1 A, 2, 14, 17, 18

[56] References Cited

U.S. PATENT DOCUMENTS

| | | | |
|---|---|---|---|
| 3,806,825 | 4/1974 | Schlosser | 331/1 A |
| 4,219,784 | 8/1980 | Detering | 331/27 |
| 4,301,423 | 11/1981 | Mülder | 331/1 R |
| 4,305,045 | 12/1981 | Metz et al. | 331/2 X |
| 4,380,742 | 4/1983 | Hart | 331/1 A |
| 4,450,518 | 5/1984 | Klee | 331/1 A X |
| 4,453,136 | 6/1984 | Kelland | 331/14 X |

Primary Examiner—Eugene R. LaRoche
Assistant Examiner—W. R. Paxman
Attorney, Agent, or Firm—Anthony T. Lane; Robert P. Gibson; Robert C. Sims

[57] ABSTRACT

A digital counter is phased locked to a reference frequency by a voltage controlled oscillator which causes the counter to increase its count rate or decrease its count rate in accordance to the presence of a one or a zero on the most significant bit of the counter at the halfway point of one cycle of the reference frequency. The counter is reset at the end of the cycle of the reference frequency. A single microprocessor which can assess this most significant bit (MSB) and vary the oscillator output, can in this manner control any number of independent phase lock loop circuits.

5 Claims, 4 Drawing Figures

MICROPROCESSOR CONTROLLED PHASE LOCKED LOOPS

DEDICATORY CLAUSE

The invention described herein may be manufactured, used, and licensed by or for the Government for governmental purposes without the payment to us of any royalties thereon.

DESCRIPTION OF THE BEST MODE AND PREFERRED EMBODIMENT

Figure 1:
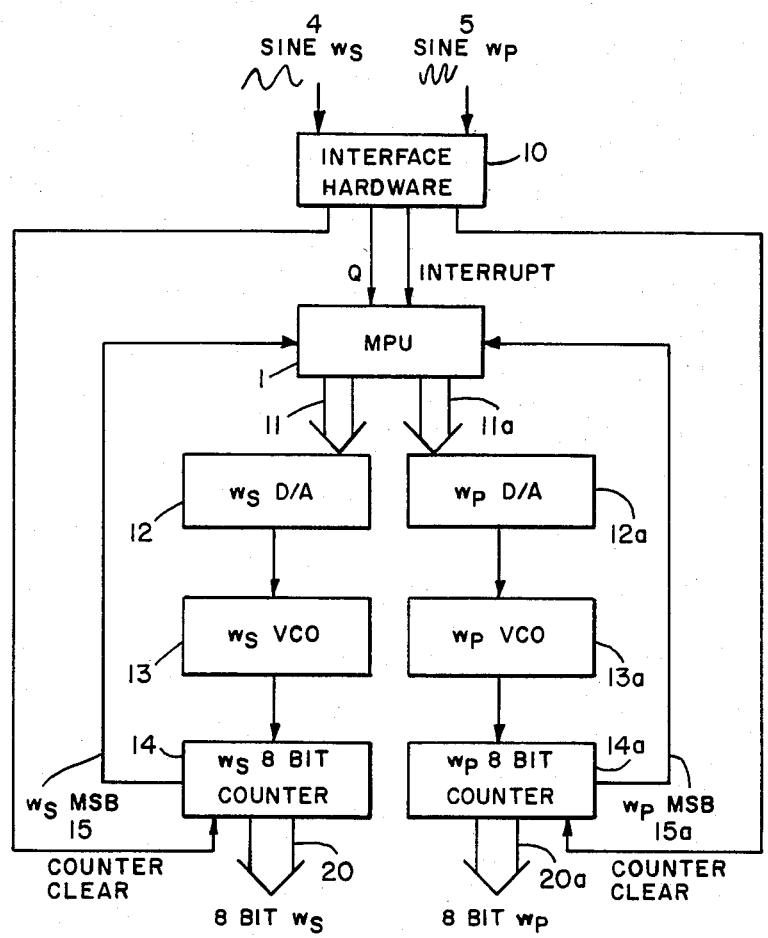
FIG. 1 is a block diagram illustrating the basic concept of the present invention.

FIG. 1 illustrates a microprocessor unit 1 (MPU) controlling two separate phase locked loops (PLLs). Any number of PLLs can be serviced utilizing this type approach with the only degradation occurring in tracking accuracy when servicing loop time becomes significant. The MPU controlled PLLs use external hardware 10 driven by reference sine waves 4 and 5 to interrupt the MPU. The MPU then executes its PLL control interrupt routine generating an 8-bit word 11 that is latched to an output digital to analog (D/A) converter 12. The D/A output drives a voltage controlled oscillator (VCO) 13 whose output is used to clock an 8-bit counter 14.

The most significant bit (MSB) 15 of the counter 14 output is utilized by the MPU to determine whether the control word to VCO 13 should be incremented or decremented. The 8-bit word 20 obtained from counter 14 is grouped into two four bit bytes for use in the hexadecimal based MPU system. The first ten counts are denoted by zero through nine. The final six counts are denoted by the letters A through F. Thus, for a two byte system the decimal numbers zero through 255 are denoted by the hexadecimal numbers 00 through FF.

Figure 2:
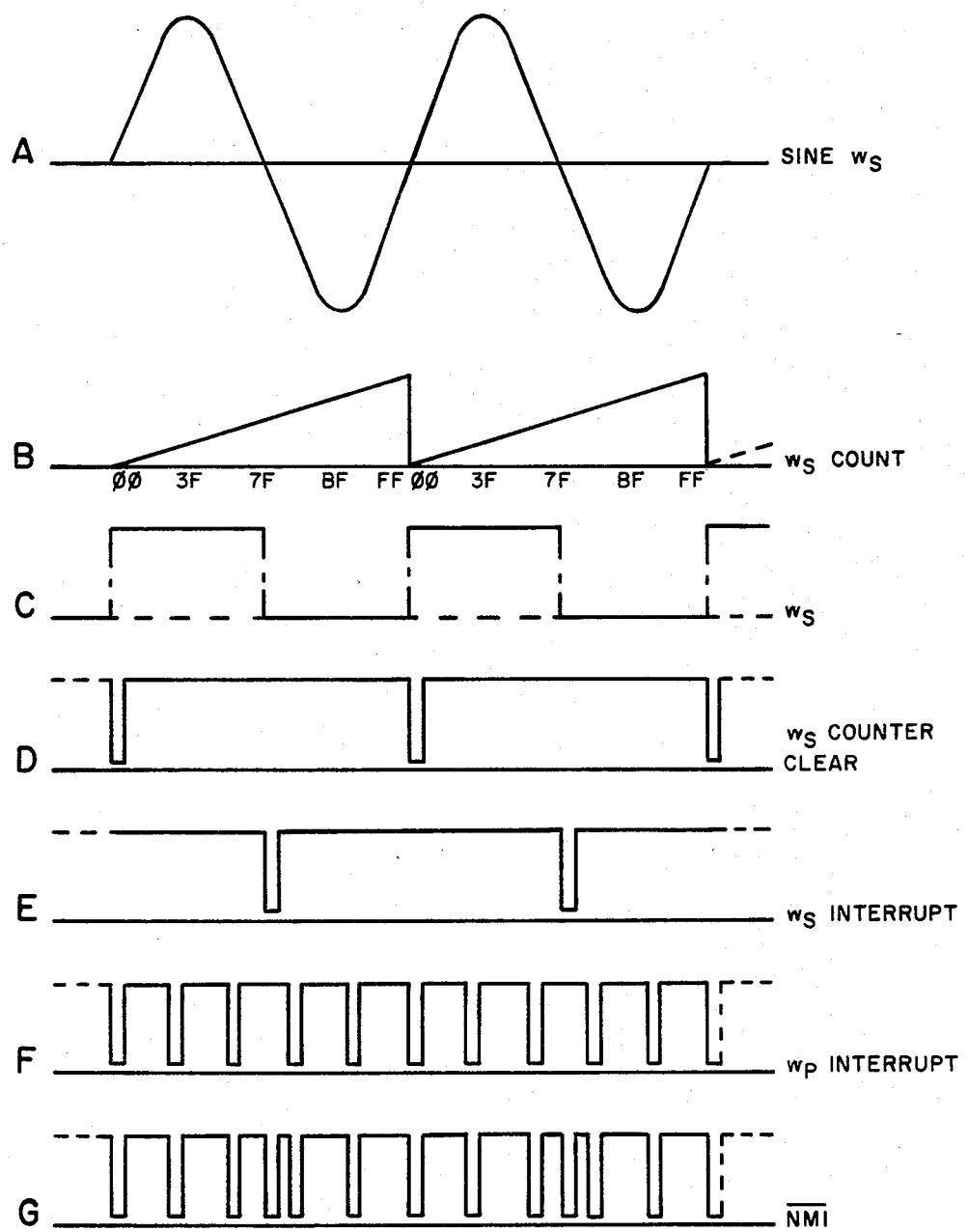
FIG. 2 is a waveform chart of the various components of FIG. 1.

When the PLL is centered and operating, the counter output should go from 00-FF once per sine wave cycle. FIG. 2, line B illustrates the relationship of the D/A counter output to the reference signal, $\omega_s$.

The MPU/PLL software program uses the MSB of the counter 20 output word to determine whether it should increment or decrement (increase or decrease) the VCO 13 control voltage. One cycle of $\omega_s$, for example, is equal to a count of FF. The counters are cleared at the beginning of each cycle. At the mid-way point of each $\omega_s$ cycle (180°) or hexadecimal 80, an interrupt pulse is hardware generated. The MPU 1 checks the MSB 15 to see if it is a one or a zero. If it is zero, the counter output word is at or below 7F, and the MPU increments the VCO control word to increase the VCO rate. If the bit is a one, the output count is at or above 80 and the VCO control word is decremented to slow the VCO. The process of clearing the counters at the beginning of each cycle keeps the output phase locked to the input reference signal 4.

The $\omega_p$PLL operates in the same manner using separate D/A 12a, hardware counter 14a and VCO 13a. Both the $\omega_s$ and $\omega_p$ interrupts toggle a flip-flop whose output is queried by the MPU to determine which PLL should be iterated.

Figure 3:
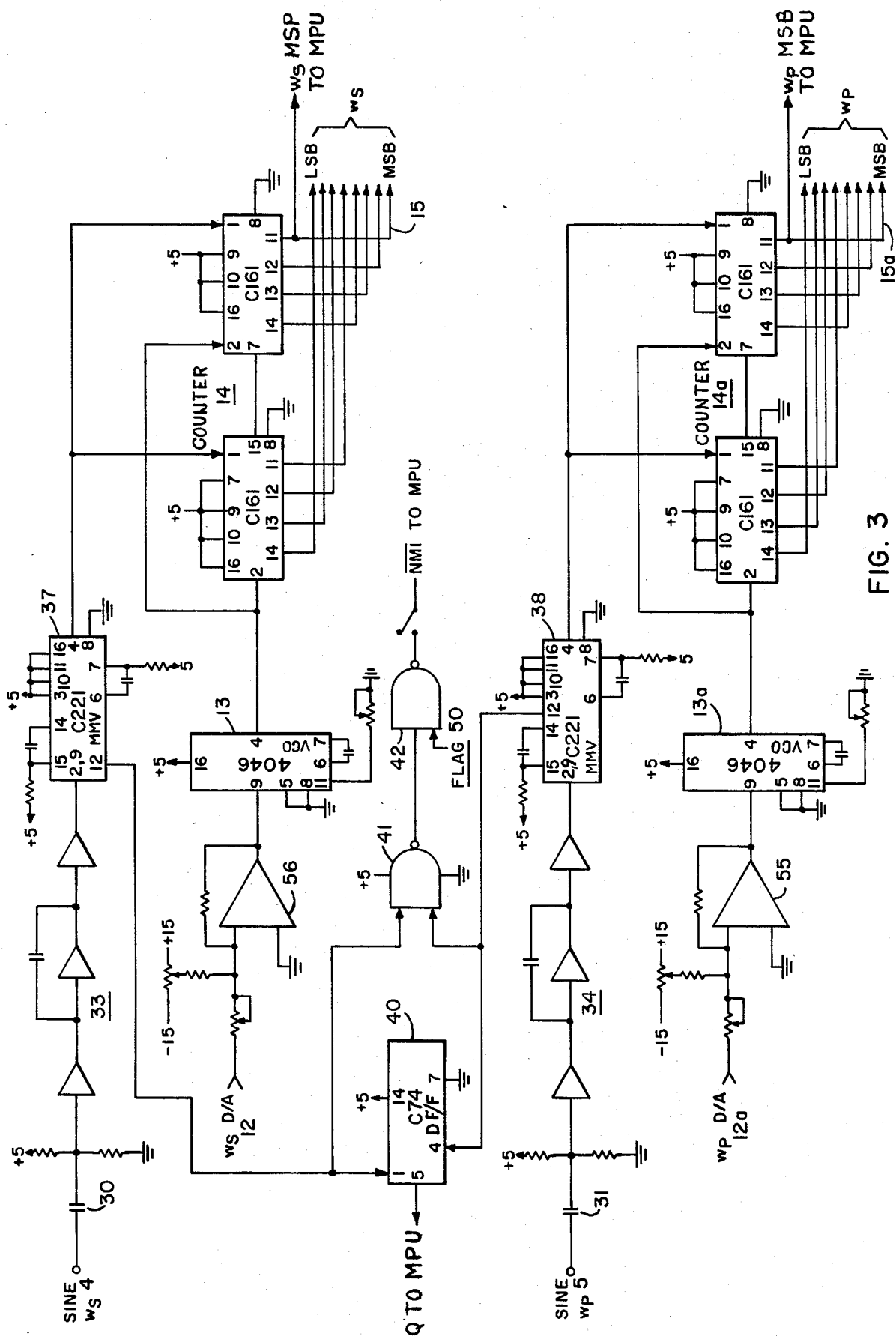
FIG. 3 is a schematic showing the essential features of the present invention.

FIG. 3 is a detailed schematic showing the hardware which can be used to carry out this invention. The $\omega_s$ or $\omega_p$ reference sine wave 4 or 5 is AC coupled by capacitor 30 or 31 into a zero crossing detector 33 and 34. The output square wave then goes to a pair of dual one shots 37 and 38 (74C221). A negative going pulse is fed to the clear inputs of the 8-bit counter 14. The other one-shot, triggered on the trailing edge, generates an interrupt pulse. This pulse goes to the clear input of the fip-flop 40 (74C74) and to a NAND gate 41 (74C00). The $\omega_p$ one shot 38 sends a pulse to the preset input of the flip-flop 40 and to the other input of the NAND gate 41. The Q output of flip-flop 40 is wired to the $2^7$ bit of the input control word. On being interrupted, the MPU queries the input control word's $2^7$ bit to determine the cause of the interrupt, $\omega_s$ or $\omega_p$.

After determining which PLL should be iterated, the MPU writes a flag bit 50 low to NAND gate 42 to disable any further interrupts until the present interrupt program has been completed. At that time, the MPU sets the flag bit and re-enables the interrupt line.

The PLL interrupt program adjusts the value of an 8-bit word which when D/A converted controls the appropriate VCO output frequency. The D/A output 12 or 12a enters an op-amp (747) configuration 55 or 56 to center the range of the control voltage going to the VCO 13 or 13a. The VCO is set to its center frequency by the values of an external resistor and capacitor. The VCO output when centered should be 256 times its reference frequency input and will drive the 8-bit counter. The most significant bit 15 of $\omega_s$ goes to the $2^6$ bit of the input control word. All bits of the $\omega_s$ and $\omega_p$ words can be hard wired to inputs of the MPU, allowing the MPU to read them and perform any other operations on them if required.

There is identically configured hardware to control both PLLs, except for values of the resistor and capacitor which determine the VCO center frequency. The most significant bit 15a of $\omega_p$ goes directly to the $2^5$ bit of the MPU input word. The schematic, FIG. 3, shows the discrete hardware used. The digital chips used are CMOS logic and are operated at five volts DC.

In reference to FIG. 2, the waveform chart shows the location of the described digital signals with respect to the $\omega_s$ sine wave. Line B shows the analog ramp function generated by a D/A conversion of the $\omega_s$ count. The output of the zero crossing detector is illustrated by line C. Although the pulse width is exaggerated for clarity, line D shows the pulse which clears the $\omega_s$ counters. On line E the $\omega_s$ interrupt is shown as it occurs on the trailing edge of $\omega_s$. The $\omega_p$ interrupt pulses are shown on line F. However, they occur with respect to the $\omega_p$ sine wave. The output non-maskable interrupt (NMI) pulses are shown on line G.

Figure 4:
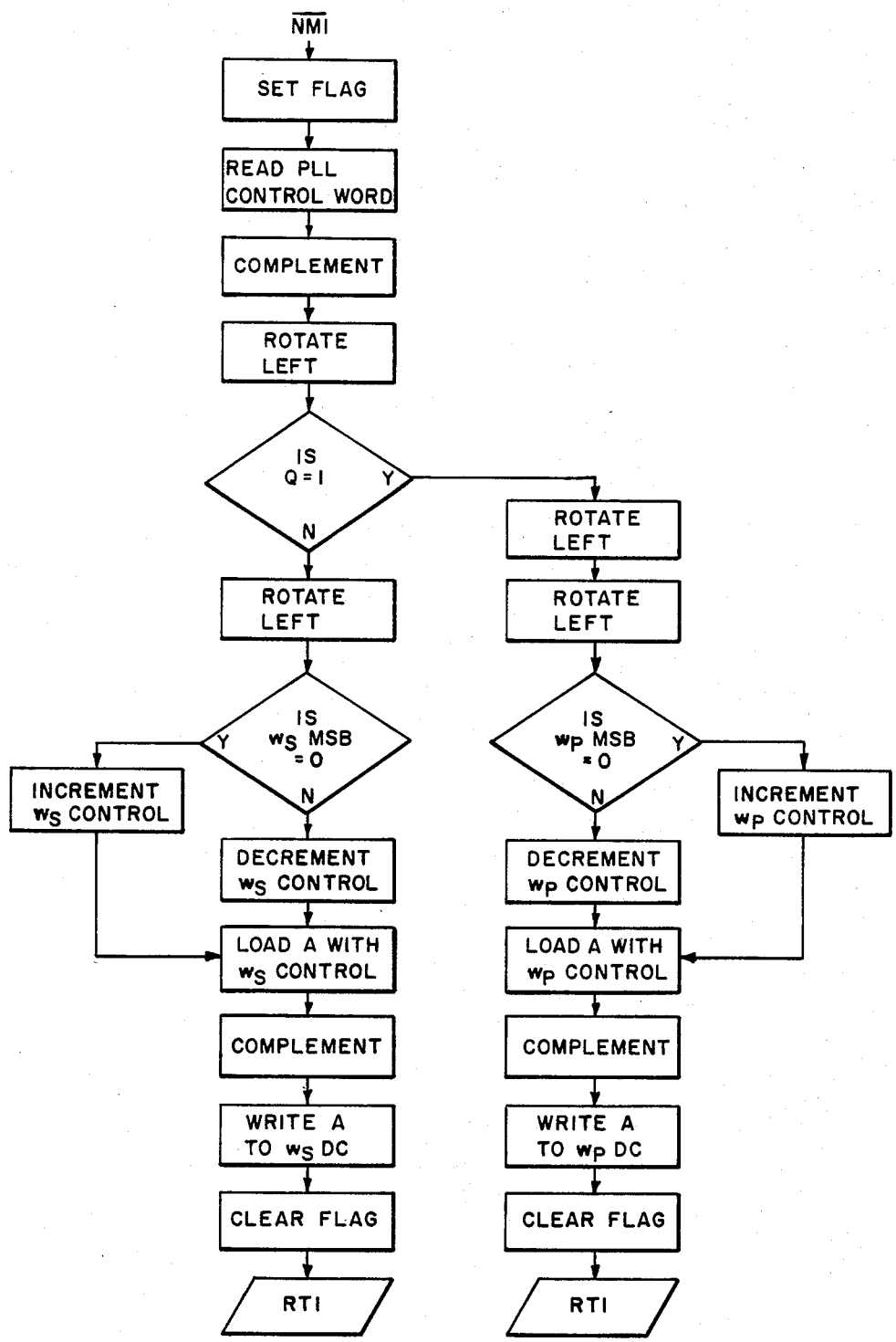
FIG. 4 is a flow chart for the program involved in the present invention.

FIG. 4 shows that the software program is an interrupt handler which is called when an NMI pulse is recognized by the MPU. The interrupt occurs on the trailing edge of $\omega_s$ or $\omega_p$. First, the flag bit is set so that the program cannot be interrupted while it is being executed. This precludes re-entry problems which occur when the two interrupt signals overlap. Next, the input control word is read into the accumulator. It is necessary to complement the input control word to compensate for the inverted data bus of the Motorola 6800 system used. The rotate left function is performed to check the status of the Q ($2^7$) bit. If Q is a zero, $\omega_s$ has interrupted the processor. Therefore the $\omega_s$ branch is taken. Another rotate left function is performed to check the status of the $\omega_s$ most significant ($2^6$) bit. If it is a one, the $\omega_s$ control word, a specified memory location is decremented. If not, the $\omega_s$ control word is incremented. Next, the accumulator is loaded with the $\omega_s$ control word and then complemented and written out to the $\omega_s$ D/A thus updating the VCO frequency using the hardware previously described. The flag bit is then cleared so that the MPU will recognize the next interrupt and the program returns from interrupt.

However, if in the first decision, Q is a one, then the $\omega_p$ branch is taken instead. Two rotate left functions are performed. Thus, the $\omega_p$ most significant ($2^5$) bit is examined. The same procedure is followed as with the $\omega_s$ most significant bit. The $\omega_p$ control word is incremented if the $2^5$ bit is a zero or decremented if it is a one. The $\omega_p$ control word is read, complemented, the written out to the $\omega_p$ D/A. Finally, after clearing the flag, the program returns from interrupt.

A study was done to determine the time required to execute the PLL program. To derive the time information, the flag bit was displayed on the oscilloscope, triggered by the appropriate sine wave. Since the first step of the program sets the flag bit low and the final step resets the flag high, the duration of the low pulse is the time used in executing the program.

The performance of PLLs is defined by the capture range and stability. However, these two functions are not independent. The capture range can be increased by increasing the gain of the D/A output, but this causes the stability to decrease because of the one bit variation each time the program is executed. In this application, the D/A output was adjusted for an acceptable stability, the capture range was measured for each PLL. The $\omega_s$ PLL capture range was 60 Hz to 200 Hz and 90 Hz to 420 Hz for the $\omega_p$ PLL. However, this wide a capture range is not necessary and can be decreased as the frequencies of $\omega_s$ and $\omega_p$ are defined.

Three major advantages warrant using the MPU-controlled PLL. First, this system has an exceedingly wide capture and tracking range. Second, the inherent edge triggered phase lock eliminates phase shift. Third, since the MPU-controlled PLL requires only a 40 microsecond execution time, several PLLS can be controlled within this system. Also, other functions can be performed by the MPU during unused time.

In addition, slight modifications to the design schematic and software can allow for the utilization of all eight bits of the $\omega_s$ and $\omega_p$ output counts. The respective eight-bit counts could be compared to the 8 expected output count and the absolute difference used to iterate the VCO control word. This modification could result in a much faster response time for "quick change" frequency applications but would result in degradation of the system stability.

We claim:

1. In a control system in which a digital counter is phase-locked to a reference frequency, an improvement comprising a processing unit connected to said digital counter for controlling the rate at which said counter counts; said reference frequency being divided into cycles and connected to said processing unit such that said processing unit can sense the start of a cycle, the half cycle point and the end of a cycle of said reference frequency; the most significant bit output of said counter being connected to said processing unit; said processing unit causing said counter to clear at the end of each cycle; and said processing unit sensing the output of said most significant bit at the half cycle point, and causing said counter to increase its rate of count if the output of the most significant bit is digital zero and causing said counter to decrease its rate of count if the most significant bit is a digital one.

2. In a control system as set forth in claim 1 further comprising a voltage controlled oscillator connected between said processing unit and said counter; the rate of the counter being controlled in accordance with frequency of the output of the voltage controlled oscillator; and the frequency of the output of the voltage controlled oscillator being controlled up or down by the processing unit in accordance with the output of the most significant bit at the half cycle point.

3. In a control system as set forth in claim 2 further comprising a digital to analog converter connected between said processing unit and said voltage controlled oscillator.

4. In a control system in which each of a plurality of digital counters is phase-locked to one of a corresponding plurality of reference frequencies, an improvement comprising a processing unit connected to said plurality of digital counters for controlling the rate at which each counter counts; each reference frequency being divided into cycles and connected to said processing unit such that said processing unit can sense the start of a cycle, the half cycle point and the end of a cycle of each reference frequency; the most significant bit output of each counter being connected to said processing unit; said processing unit causing each counter to clear at the end of each cycle of its corresponding reference frequency; and said processing unit sensing the output of said most significant bit of each counter at the half cycle point of its corresponding reference frequency, and causing each counter to increase its rate of count if the output of its most significant bit is digital zero and causing each counter to decrease its rate of count if its most significant bit is a digital one.

5. In a control system as set forth in claim 4 wherein said processing unit is divided into first and second parts; said first part being connected to said reference frequencies and to said counters; said first part being connected to said second part so as to allow said second part to sense when the half cycle point of a cycle of each reference frequency has occurred; and the most significant bit of each counter being connected to said second part for adjustment of the rate at which each counter counts so as to cause each counter to have a maximum count under steady state conditions when its associated reference frequency reaches the end of a cycle.

* * * * *